(12) United States Patent
Huang et al.

(10) Patent No.: US 9,306,101 B2
(45) Date of Patent: Apr. 5, 2016

(54) GROUND APPARATUS

(71) Applicant: HULK ENERGY TECHNOLOGY CO., LTD., Miaoli County (TW)

(72) Inventors: Ting-Hui Huang, Miaoli County (TW); Chien-Chung Wu, Miaoli County (TW)

(73) Assignee: HULK ENERGY TECHNOLOGY CO., LTD., Miaoli County (TW)

( * ) Notice: Subject to any disclaimer, the term of this patent is extended or adjusted under 35 U.S.C. 154(b) by 0 days.

(21) Appl. No.: 14/554,485

(22) Filed: Nov. 26, 2014

(65) Prior Publication Data

US 2015/0144373 A1 May 28, 2015

(30) Foreign Application Priority Data

Nov. 26, 2013 (TW) .............................. 102222107 U

(51) Int. Cl.
| | |
|---|---|
| *H01L 31/05* | (2014.01) |
| *H01L 31/02* | (2006.01) |
| *H02S 40/36* | (2014.01) |
| *H02S 40/34* | (2014.01) |
| *H01R 4/66* | (2006.01) |

(52) U.S. Cl.
CPC .......... *H01L 31/05* (2013.01); *H01L 31/02021* (2013.01); *H01R 4/66* (2013.01); *H02S 40/34* (2014.12); *H02S 40/36* (2014.12)

(58) Field of Classification Search
CPC . H01L 31/05; H01L 31/0504; H01L 31/0508; H01L 31/0512; H01L 31/0516
See application file for complete search history.

(56) References Cited

U.S. PATENT DOCUMENTS

| | | | | |
|---|---|---|---|---|
| 2012/0026067 | A1* | 2/2012 | Parsche | ............. H01L 31/02008 343/904 |
| 2012/0138120 | A1* | 6/2012 | Fernandez | ............. H01L 31/042 136/246 |
| 2012/0228104 | A1* | 9/2012 | Kirkham | ........... H01L 31/02021 200/337 |
| 2014/0048124 | A1* | 2/2014 | Park | ........................ H02S 20/30 136/251 |

* cited by examiner

*Primary Examiner* — Jeremy C Norris
(74) *Attorney, Agent, or Firm* — WPAT, PC; Justin King

(57) ABSTRACT

A ground apparatus applicable to an array of solar cell modules includes at least one first ground unit and a plurality of second ground units, and a plurality of depression plates. The first ground unit mounted to a lateral side of one specific solar cell module includes a grounding dock coupling to an outextending ground line. The second ground unit mounted at a lateral side of each respective solar cell module also has another grounding dock. Any of the grounding docks is formed as a ⊓-shape metal plate having two opposing prolonged ends to extend outward, in which each of the ends has at least one matching member, or in which each of the ends is extended to a respective matching frame of the solar cell modules. In addition, the ground apparatus is fixed with a predetermined fastening pattern.

24 Claims, 21 Drawing Sheets

17

GROUND APPARATUS

This application claims the benefit of Taiwan Patent Application Serial No. 102222107, filed Nov. 26, 2013, the subject matter of which is incorporated herein by reference.

BACKGROUND OF INVENTION

1. Field of the Invention

The invention relates to a ground apparatus, and more particularly to the ground apparatus applied to solar cell modules that can be both simply structured and easily assembled.

2. Description of the Prior Art

Grounding for solar photovoltaic modules is necessary for assuring the safety to people and the working environment. In the solar photovoltaic system, the solar photovoltaic module is the main element for transforming the solar energy into electric energy. For the solar photovoltaic module would continue to provide a high voltage, in the case that the solar photovoltaic module needs maintenance or replacement, the labor would expose himself/herself in a danger of electric hazard, or the system might be power out due to the damage of the inverter. For most of the solar photovoltaic modules are outdoor units and won't stop their own power generation, the danger of electric hazard is never away. In particular, when a single solar photovoltaic module is connected in series to a photovoltaic array, the maintenance worker would face a risk of electric hazard that would discharge an accumulative voltage from all the connected modules. In addition, no matter what the solar photovoltaic system is a commercial unit or a domestic unit, the system is usually mounted to the roof or a place near the peak of the building. If neighboring constructions are all lower than the building mounting the solar photovoltaic system, the solar panels of the system would be the highest metals in the surrounding area, and inevitably become the easy targets for thunder bombarding. At this time, the ground system provides the least protection against the aforesaid dangers. Further, for the service life of the solar photovoltaic system usually exceeds 40 or 50 years, it is necessary to take into consideration the problem of how to keep a long-term reliable ground system.

Currently, in the safety specs for the solar photovoltaic system, the UL requirements ask the product to have at least minimum mechanical and conductive properties between side frames. In NEC of the US, it is further asked to ground all the conductive surfaces. Namely, each side frame of the solar photovoltaic module shall be grounded. Nowadays, side frames for the solar photovoltaic module are mostly made of aluminum. In order to the endurance, appearance and safety, the side frames are usually prepared by surface polishing, coating and anodizing.

Referring now to FIG. 8, the ground apparatus 200 of the conventional solar cell module is formed by packing the solar panels 220 and the bottom portions of the respective frames 230 located at four corners of the corresponding solar panel. While a worker performs the mounting or installing of a solar energy system in accordance with the aforesaid specs, the solar cell modules are placed on top of a supportive frame 300. Between two solar cell modules, a ⊔-shape fastener member 250 is introduced to fix four specific positions at two opposing ends of the vertical frame 230 by respective ground fixation members having individual nuts, washers and screw bolts 240. The conventional ground structure 210 located at a bottom surface 211 of the conjunction of neighboring frames 230 is fixed to the system by a screw bolt 212, an external washer 213, a ground line 214, a flat washer 215, a star-shape washer 216 and a nut 217. Also, the aforesaid conventional ground structure 210 exists in each single solar cell module.

Nevertheless, for the typical solar power system includes a plurality of solar cell modules, while in grounding the system, individual ground line shall be installed to the bottom surface of the frame in each solar cell module. However, for a worker to execute the grounding construction, the working space under the system is extremely limited and narrow. Also, further for the ground line of the solar cell module might need to be extended through a long distance to a perfect ground location, the efficiency and the convenience for the aforesaid grounding setup is extremely low.

SUMMARY OF THE INVENTION

Accordingly, it is the primary object of the present invention to provide a ground apparatus for an array of solar cell modules, which can not only meet the safety specs but also efficiently improve the convenience, the material usage and the material cost of the grounding setup by introducing a bridging technique.

To achieve the foregoing object, the ground apparatus in accordance with the present invention is particularly applicable to an array of solar cell modules. The array of solar cell modules includes a plurality of solar cell modules, and each of the solar cell modules includes at least one solar panel and a plurality of matching frames packed fixedly to respective lateral sides of the at least one solar panel. The plurality of the solar cell modules are arranged in an array pattern. The ground apparatus comprises at least one first ground unit and a plurality of second ground units.

The at least one first ground unit, mounted at a lateral side of the solar cell module, includes a grounding dock and is outstretched to couple an out-going ground line.

Each of the second ground units, mounted to a lateral side of the respective solar cell module, further has the grounding dock.

In the present invention, the grounding dock is formed as a ⊓-shape metal plate having two opposing prolonged ends, and each of the prolonged ends includes at least one embedded member. The ground apparatus is fixed in a predetermined fastening pattern, which is a type of embedding fixation. Alternatively, the grounding dock is a ⊓-shape metal plate having two opposing ends extending outward to reach the respective matching frames. Also, the ground apparatus is fixed in a predetermined fastening pattern, which introduces an additional member to perform the fixation.

All these objects are achieved by the ground apparatus described below.

BRIEF DESCRIPTION OF THE DRAWINGS

The present invention will now be specified with reference to its preferred embodiment illustrated in the drawings, in which:

FIG. 7A and FIG. 7B illustrate an embodiment of the predetermined fastening pattern for the ground apparatus in accordance with the present invention in a perspective view and a cross-sectional view, respectively;

FIG. 7C through FIG. 7E show perspective various embedding-type grounding docks in accordance with the present invention.

DESCRIPTION OF THE PREFERRED EMBODIMENT

Figure 1A:
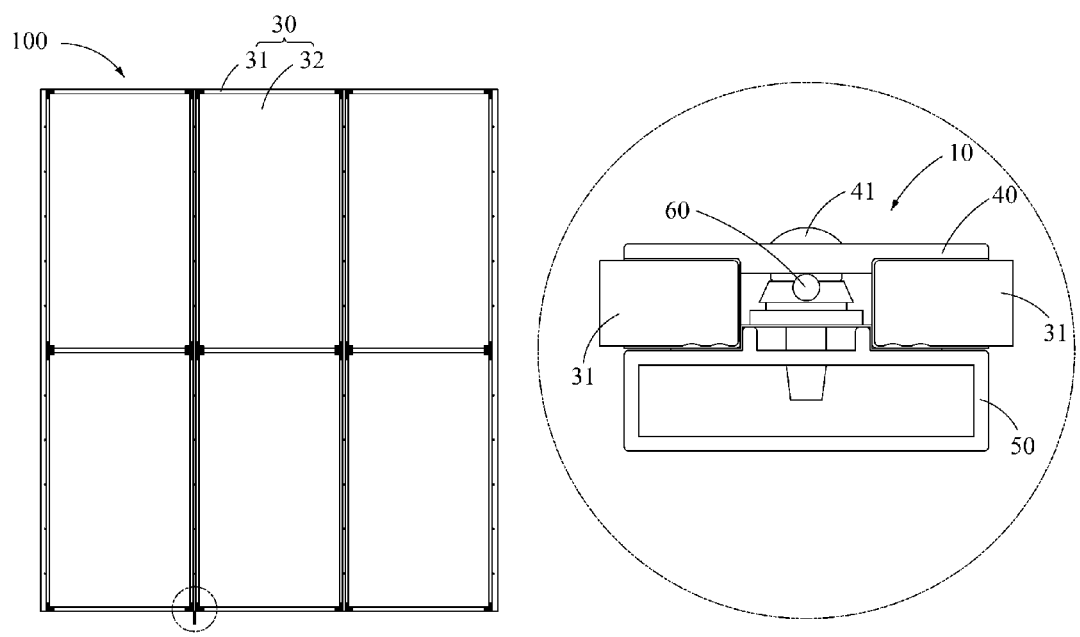
FIG. 1A shows schematically the position and the composition of an embodiment of the first ground unit of the ground apparatus in accordance with the present invention.

The invention disclosed herein is directed to a ground apparatus. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

In order to elucidate concisely the present invention, the following embodiments are detailed by accompanying drawings. However, it shall be understood that the following descriptions upon the embodiments are mainly toward to explain clearly the structuring of the ground apparatus among the plural solar cell modules, and all other engineering such as the fixation members among the modules (including supportive frames, depression plates and locking members), the lining layout of the modules, components for the construction and operational specifications are already matured arts and thus omitted herein.

Refer simultaneously to FIGS. 1A-1B and 2A-2B, an embodiment of the array 100 of solar cell modules and an accompanying ground apparatus for the array in accordance with the present invention are shown in various figures. In this embodiment, a 2×3 array 100 of the solar cell modules are shown, but the present invention is not limited to such an embodiment. The array 100 of solar cell modules includes a plurality of solar cell modules 30, a plurality of supportive frames 50 and a plurality of depression plates 40. The ground apparatus includes at least one first ground unit 10, a plurality of second ground units 20 and a ground line 60.

Figure 1B:
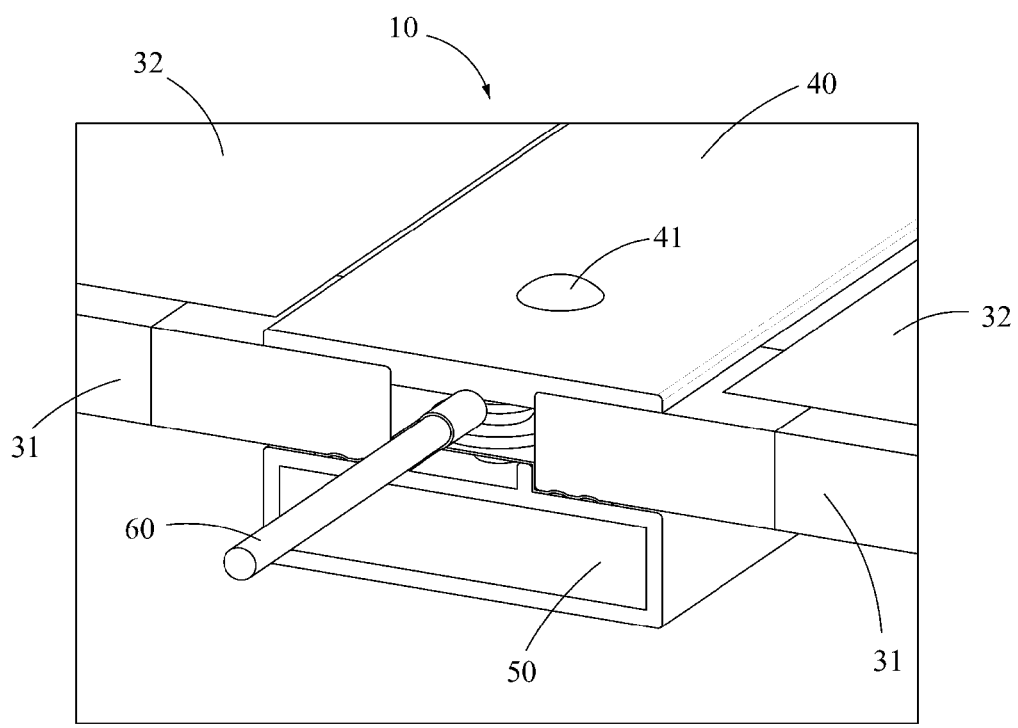
FIG. 1B is a perspective view of the ground apparatus in accordance with the present invention.

In FIG. 1A and FIG. 1B, each of the solar cell modules 30 includes a solar panel 32 and a plurality of matching frames 31 packed fixedly to each lateral sides of the solar panel 32. The matching frame 31 can be made of a metal or an alloy that is hard to be oxygenized, such as, but not limited to, an aluminum alloy, a stainless steel and so on. The solar cell modules 30 are arranged on the supportive frames 50 in an array manner.

The supportive frames 50, each of these formed as a hollow metallic frame structure, are assembled into a right-angle crossing pattern with respect to the arrangement in the array. Preferably, the supportive frames 50 can be structured into, but not limited to, a unique piece or an assembled structure. In particular, each of the supportive frames 50 is located at a place between two neighboring solar cell modules 30. Further, in this embodiment, surfaces of the solar cell modules 30 corresponding to the supportive frame 50 can, but not limited to, have a plurality of holes arranged in a specific interval. It shall be noted that the supportive frames 50 shown herein is simply one of various applicable supportive frames in the art, and thus such a disclosure of the supportive frame 50 shall not limited the scope of the present invention. Further, for the goal of the present invention is to provide the ground apparatus, so various engineering of the supportive frames applicable to the ground apparatus would be omitted herein.

The depression plate 40 formed as a non-conductive cover plate can be mounted parallel to the solar cell modules 30, the first ground unit 10 and the second ground unit 20. Portion of the depression plate 40 contacts at the matching frame 31. In this embodiment, the depression plate 40 can further include a plurality of depression plate fasteners 41 arranged in the aforesaid specific intervals. The depression plate fasteners 41 can be (but not limited to) screws, rivets, sets of screw and nut, and so on.

The first ground unit 10, selectively mounted at one lateral side of the respective solar cell module 30 or mounted between two neighboring solar cell modules 30, is coupled with the out-extending ground line 60. The location for the first ground unit 10 shown in FIG. 1A is a typical mounting place, but shall not be limited to it. In the embodiment shown in FIGS. 1A, 2A and 3A~3F, a typical mounting of the first ground unit 10 and the second ground unit 20 are shown. In this 2×3 array of the solar cell modules, only a set of the first ground unit 10 and the out-extending ground line 60 is needed, but the first ground unit 10 is not limited to the location as shown. The first ground unit 10 is coupled electrically with the ground line 60, and the ground line 60 is extended in a manner of out of the array.

Figure 2A:
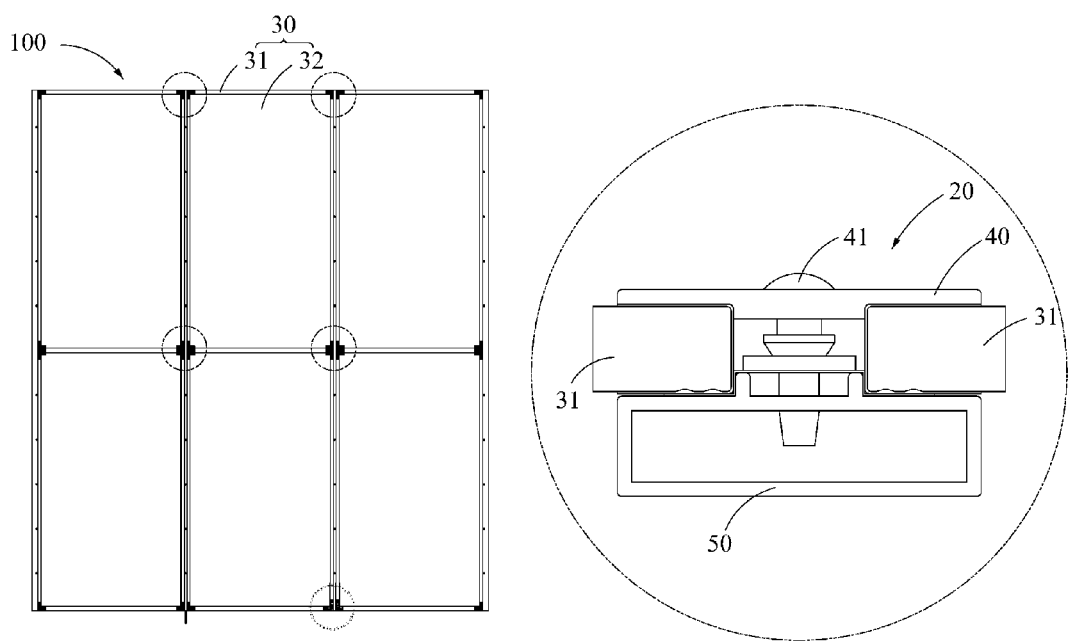
FIG. 2A shows schematically the position and the composition of an embodiment of the second ground unit of the ground apparatus in accordance with the present invention.
Figure 2B:
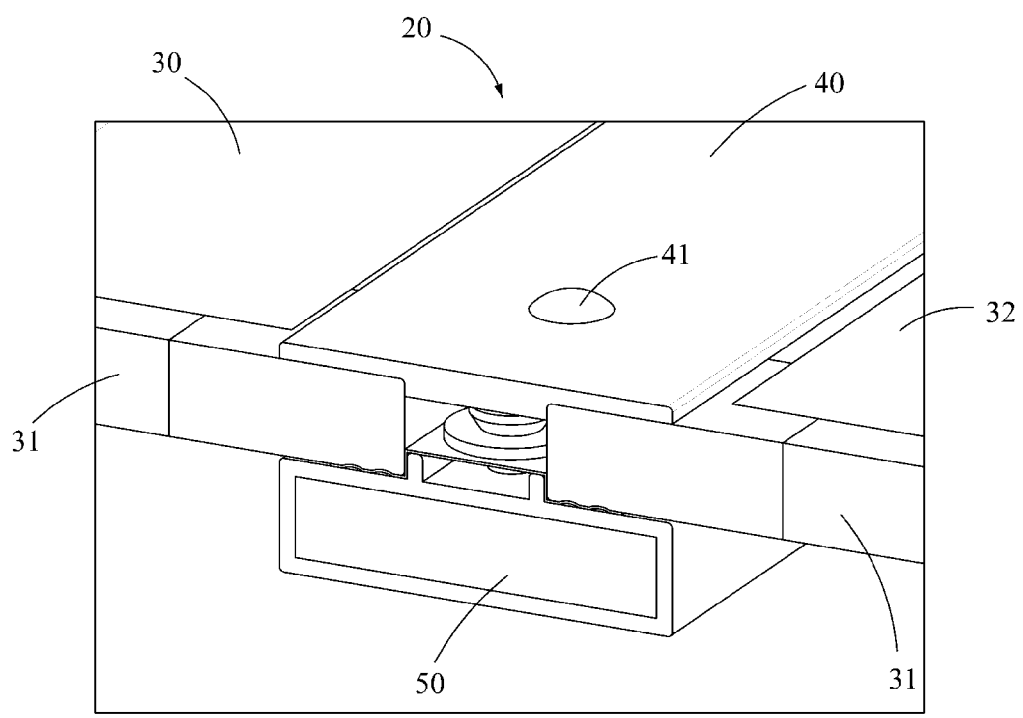
FIG. 2B is another perspective view of the ground apparatus in accordance with the present invention.

Referring now to FIG. 2As and FIG. 2B, the second ground structure for the array of this present invention is shown. Major differences between this embodiment and that shown in FIG. 1As and FIG. 1B are explained in the following section.

Except for those locations the position the first ground units 10, the second ground units 20 can be also installed to the conjunction between the neighboring solar cell modules 30, or to a lateral sides of specific solar cell modules 30. Refer also to FIGS. 2A~2B and 3A~3F, in which various embodiments for mounting the second ground units 20 at the array of the solar cell modules are provided so as to help the skilled person in the art to thoroughly understand features of the present invention in this manifold. Further, contrary to the first ground units 10, the second ground units 20 are not coupled electrically with the ground lines 60.

Typically, the array 100 of the solar cell modules in this embodiment has at least one out-extending ground lines 60, but definitely the number of the ground lines 60 is not limited to the aforesaid number.

Referring now to FIGS. 3A~FIG. 3F, plenty of locations at the array 100 for mounting the ground apparatus of the present invention (particularly the second ground units 20) are clearly provided.

Figure 4A:
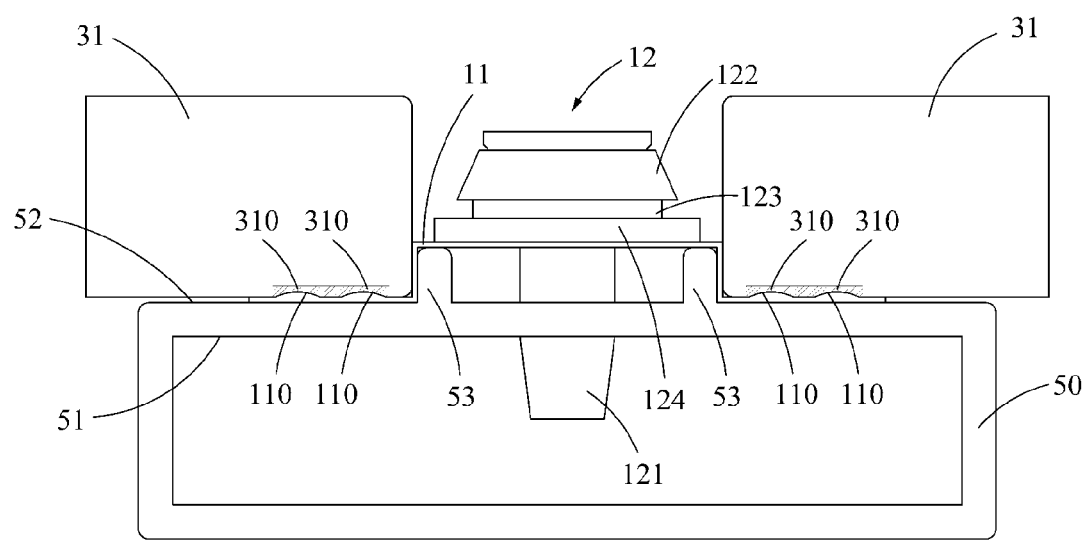
FIG. 4A is a schematic side view of an embodiment of the ground apparatus in accordance with the present invention.
Figure 4B:
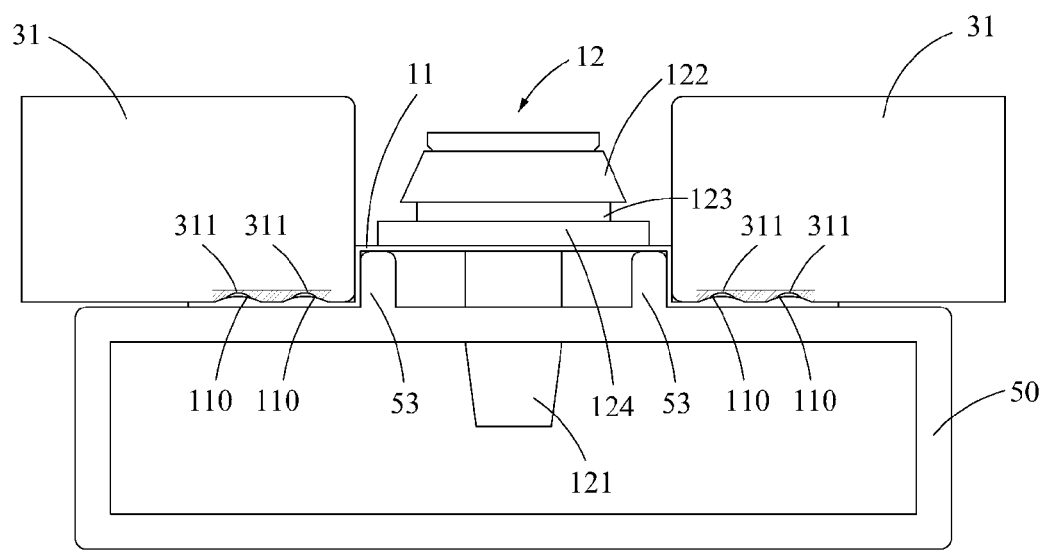
FIG. 4B is a schematic side view of another embodiment of the ground apparatus in accordance with the present invention.
Figure 4C:
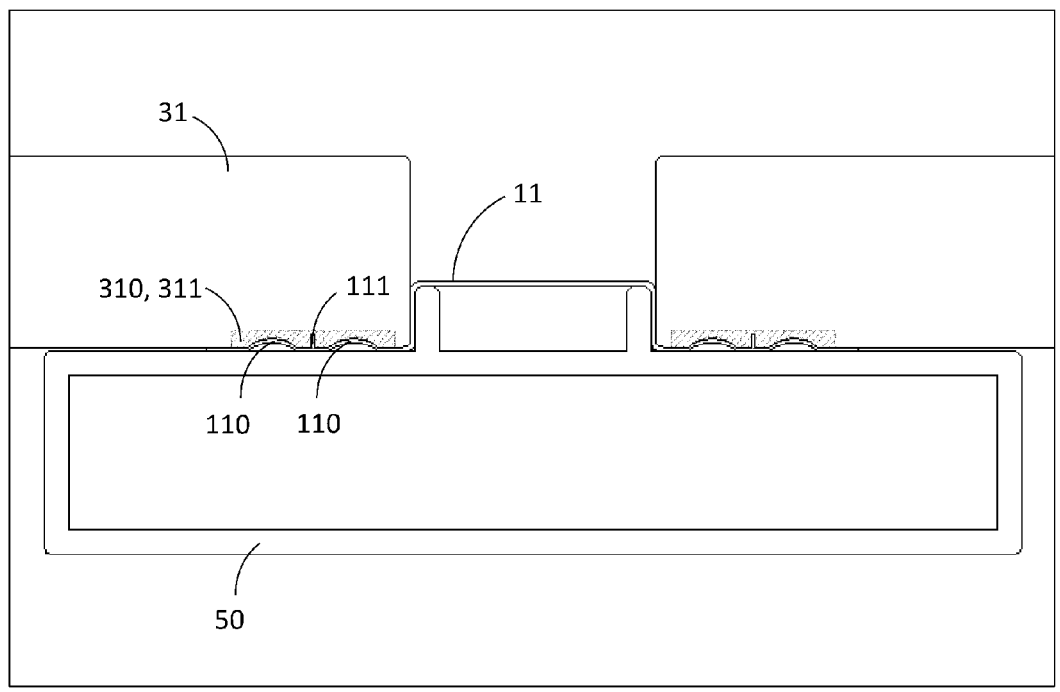
FIG. 4C is a schematic side view of a further embodiment of the ground apparatus in accordance with the present invention.

Referring now to FIGS. 4A~4C, an embodiment of the predetermined fastening pattern for the first ground unit 10 (excluding the ground line 60), the solar cell modules 30 and the supportive frame 50 are configured. For the second ground units 20 and the first ground units 10 have similar coupling structures but different in connecting the ground line 60, so in the following description only the application of the first ground units 10 is provided to explain the conduction relationship in between with the solar cell modules 30. However, details for ground line 60 and the locking members, which are not directly related to the aforesaid conduction relationship, would be omitted herein. Also, for the conduction relationship between the second ground units 20 and the solar cell modules 30 are similar to that for the first ground units 10 and the solar cell modules, so details thereto are omitted herein as well.

As shown in FIG. 4A, in this embodiment of the ground apparatus, the first ground unit 10 includes a grounding dock 11 to formulate the conduction relationship with a single grounding dock. The first ground unit 10 is fixed according to the predetermined fastening pattern that fixes the first ground unit 10 onto the supportive frame 50 through a ground fixation member 12.

In the present invention, the embodiment of the supportive frame 50 can be various and shall not be limited to the one shown in the figure. The upper portion of the supportive frame 50 has an interior lower surface 51 and an exterior upper surface 52. Two symmetric protrusions 53 are raised from the upper surface 52 of the supportive frame 50 so as thereby to form the inner installation stops of the two solar cell modules 30 on the supportive frame 50.

The grounding dock 11 formed as a ⊓-shape metal plate has two opposing prolonged ends to extend outward to be sandwiched between the upper surface 52 and the matching frames 31 of the respective solar cell modules, in a manner of contacting firmly with the matching frames 31 of the corresponding solar cell modules and the upper surface 52. In addition, the end portion of each prolonged end of the bridge 11 is formed as a pattern end with at least one flange 110. The ⊓-shape bridge is to ride, by sleeving, onto the two protrusions 53. The central portion of the grounding dock 11 can preferably be parallel to the upper surface 52 of the supportive frame 50 and further has a hole.

As described above, the grounding dock 11 has its two prolonged ends with the flanges 110 to contact with the matching frame 31. Further, the matching frame 31 can has a surface coating for insulation, in which the surface coating can be a metallic oxidized layer or an anodization layer. In this embodiment, the coating on the flanges 110 and on the contacting surfaces (i.e. the conductive surfaces 310) between the grounding dock 11 and the matching frame 31 shall be removed so as to have the electrons accumulated on the matching frame 31 able to be transmitted out of the ground apparatus through the conductive surfaces 310 and the grounding dock 11.

The ground fixation member 12 in located within the two protrusions 53 or in the central hollow portion of the supportive frame 50. As shown, the ground fixation member 12 is preferably mounted exterior to the exterior upper surface 52.

The ground fixation member 12 includes a screw bolt 121, a first washer 122, a connection terminal 123 and a second washer 124. The screw bolt 121 is to integrate by penetrating the respective holes and thus fix firmly the other three components 122, 123, 124, the grounding dock 11 and the supportive frame 50. In this embodiment, the first washer 122 and the second washer 124 can be cup washers, flat washers, star-shape washers, or any combination of the foregoing washers.

Referring now to FIG. 4B, another embodiment of the ground apparatus in accordance with the present invention is shown. The first ground unit 10, the same structure as the aforesaid one, is formed as a single grounding dock for communicating electric charges.

Figure 3A:
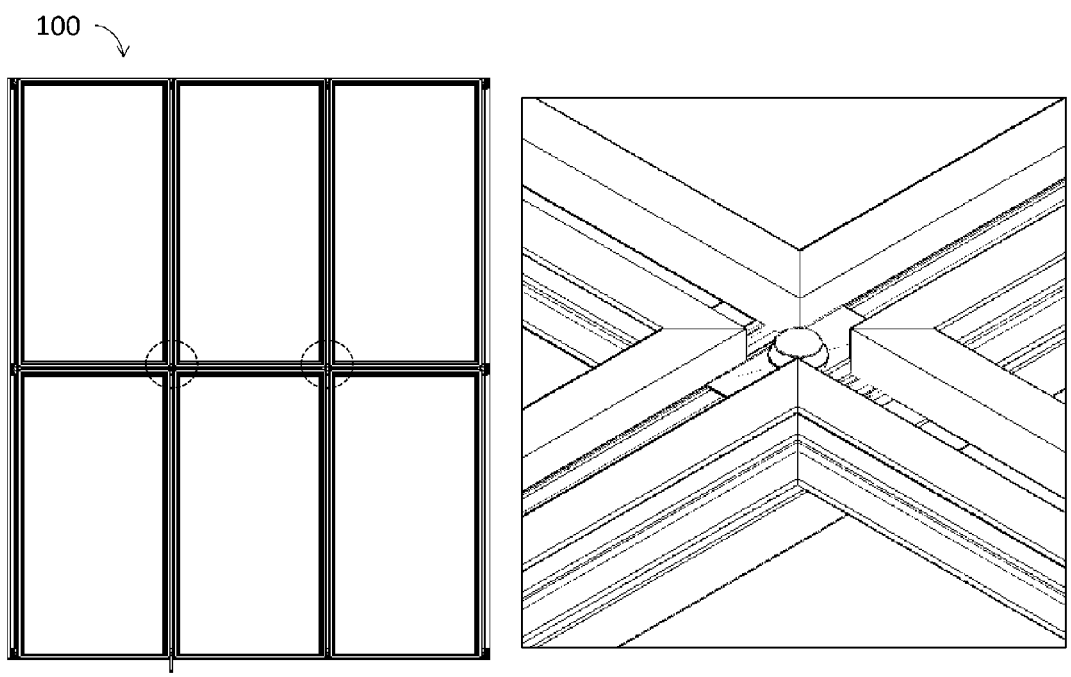
FIG. 3A shows schematically a middle position of the ground apparatus in accordance with the present invention.
Figure 3B:
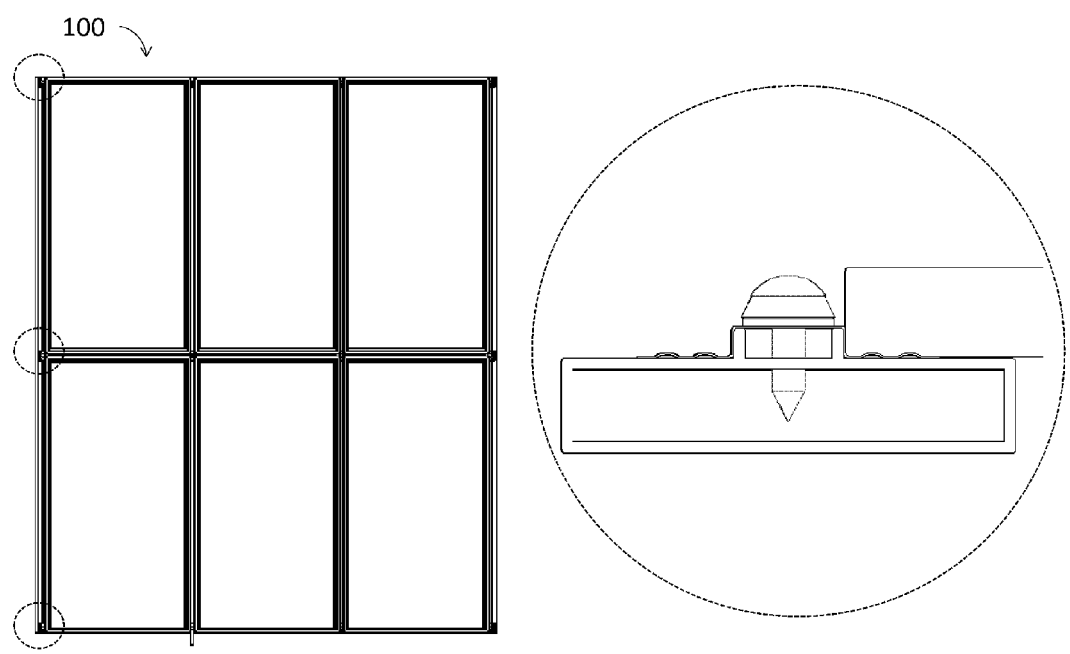
FIG. 3B shows schematically a lateral position at one side of the ground apparatus in accordance with the present invention.
Figure 3C:
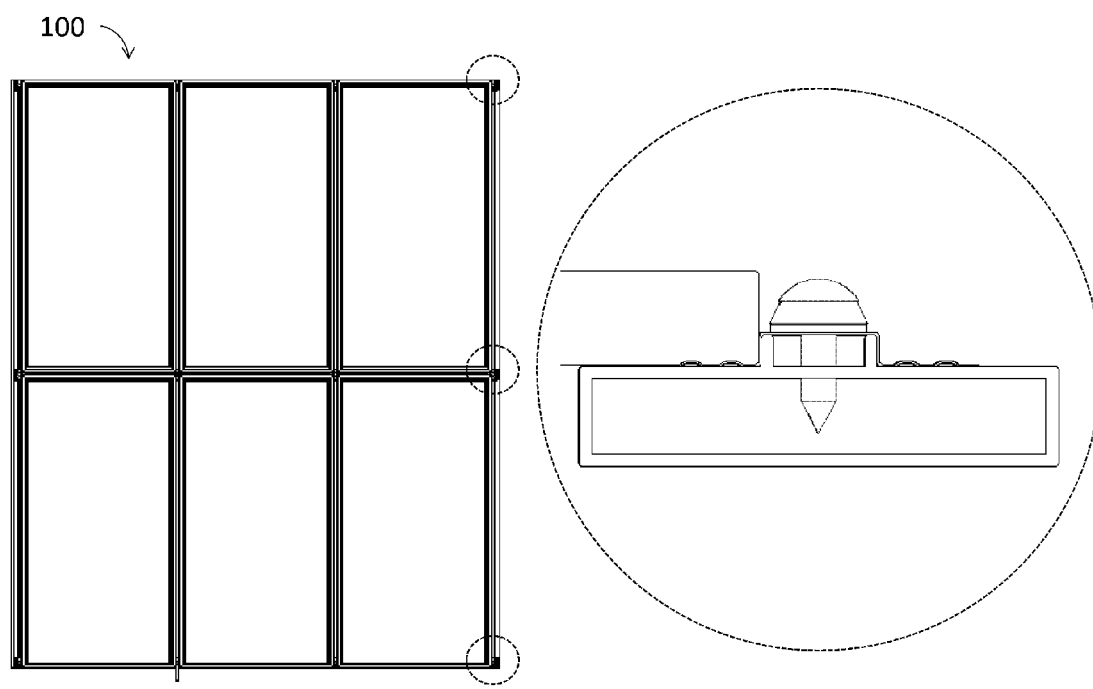
FIG. 3C shows schematically a lateral position at another side of the ground apparatus in accordance with the present invention.
Figure 3D:
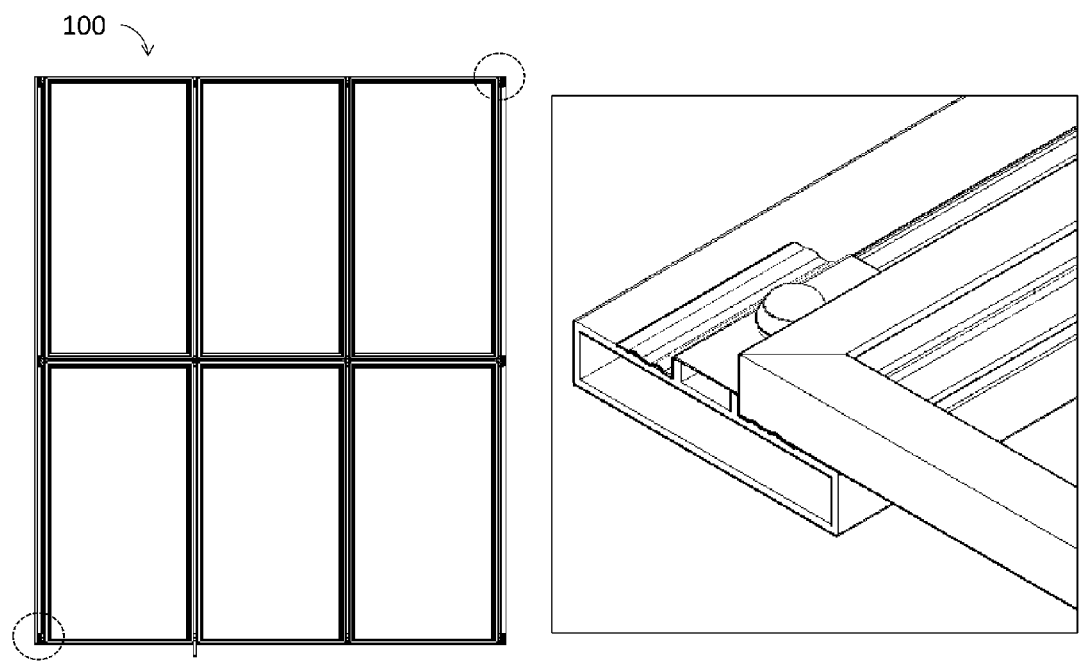
FIG. 3D shows schematically a corner position of the ground apparatus in accordance with the present invention.
Figure 3E:
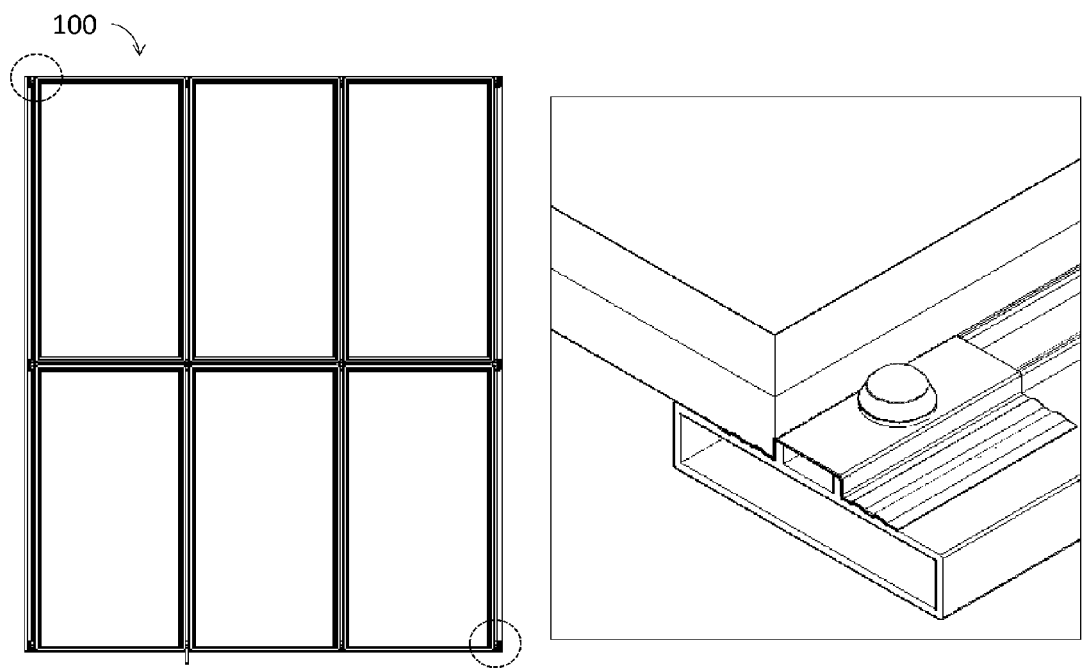
FIG. 3E shows schematically another corner position of the ground apparatus in accordance with the present invention.
Figure 3F:
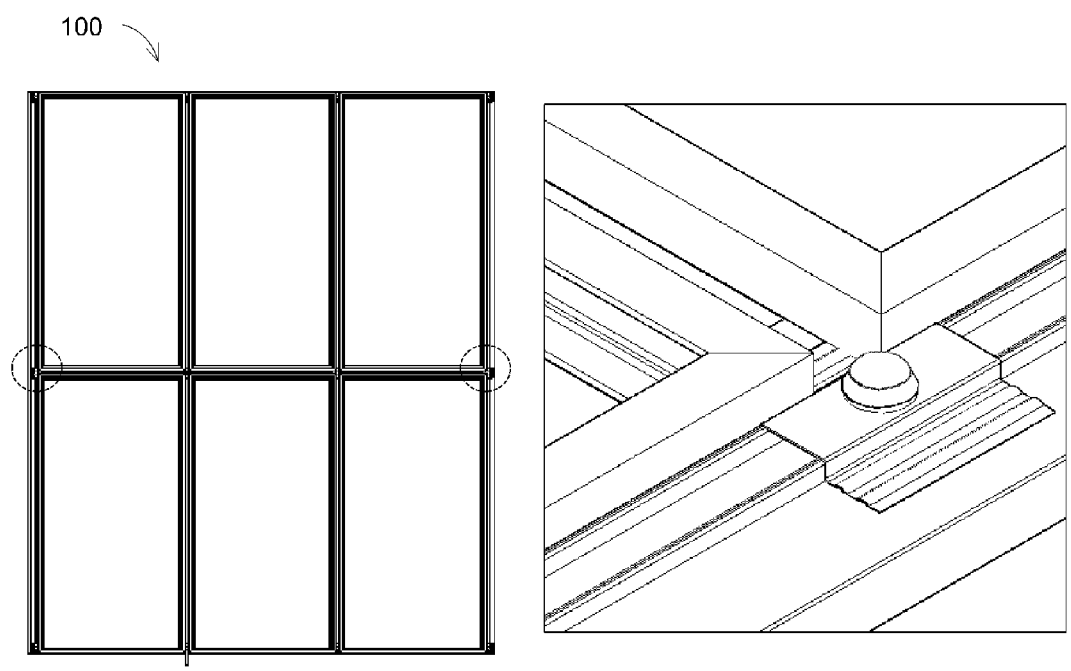
FIG. 3F shows schematically a lateral middle position of the ground apparatus in accordance with the present invention.

By comparing the ground apparatus of FIG. 4B to that of FIG. 4A, the major difference is that the matching frame 31 of FIG. 3B further includes grooves located in correspondence to the flanges 110 and the corresponding conductive groove 311 is furnished by removing the coating thereof. Upon such an arrangement, the hill portion of the flange 110 can fit tightly with the conductive groove 311 so as thereby to enlarge the contact area from a limited point contact to a broader surface contact. As a preferable result, the elimination of the accumulated electrons can be better ensured.

Referring now to FIG. 4C, a further embodiment of the ground apparatus (excluding the ground fixation member 12) in accordance with the present invention is shown. The first ground unit 10, the same structure as the aforesaid one, is formed as a single grounding dock for communicating electric charges.

By comparing the ground apparatus of FIG. 4C to that of either FIG. 4A or FIG. 4B, the major difference is that each of the two opposing extending ⊓-shape ends of the grounding dock 11 further includes at least one knife protrusion 111 except for the flanges 110. The knife protrusion 111 can be located at any position that is able to contact the conductive surface 310 of the matching frame 31. In FIG. 4C (but not limited thereto), the knife protrusion 111 is located between the two flanges 110. The arrangement of providing the knife protrusion 111 to the grounding dock 11 for directly contacting the uncoated metal surface 310 of the matching is to assure the flow-ability of electric charges between grounding dock 11 and the matching frame 31 while in meeting an improper-connection situation between the flange 110 and the conductive surface 310 or the conductive groove 311. Further, while the hardness of the grounding dock 11 is higher than that of the matching frame 31, the knife protrusion 111 is then able to pierce the uncoated area of the matching frame 31, and thus the local flow-ability of the electric charges can be further ensured.

Figure 5A:
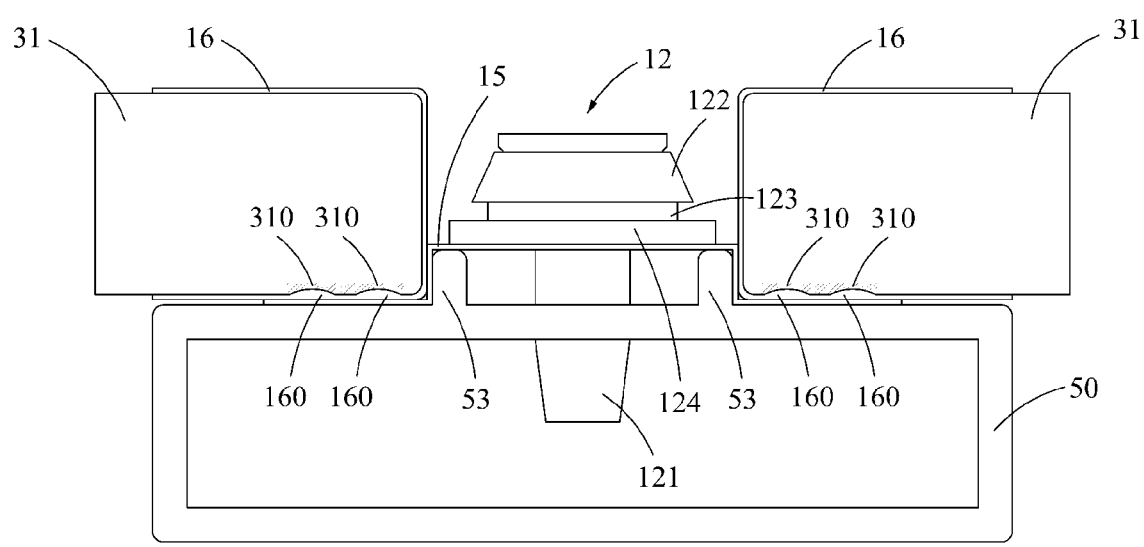
FIG. 5A is a schematic side view of one more embodiment of the ground apparatus including the conductive clamp structures in accordance with the present invention.
Figure 5B:
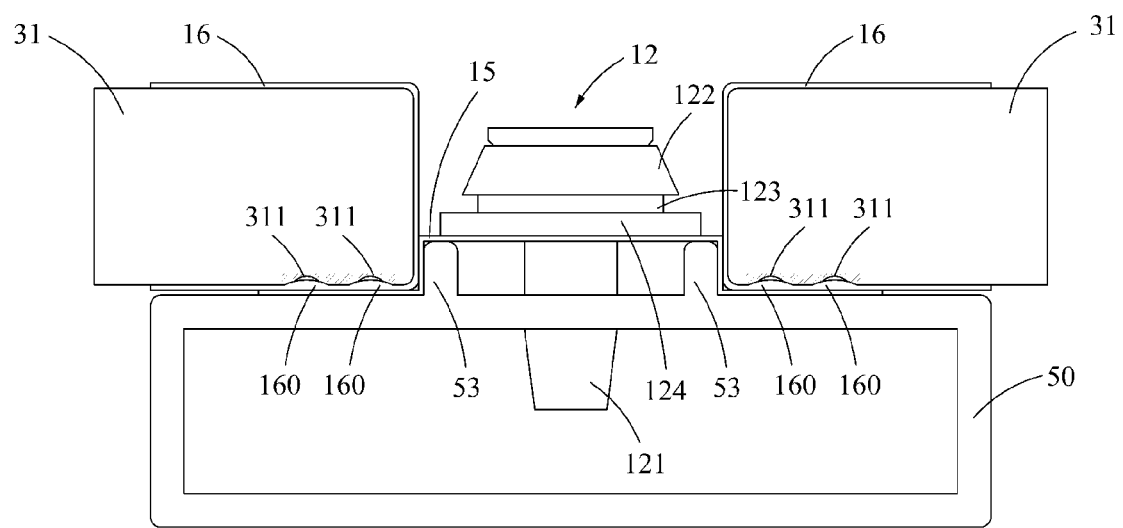
FIG. 5B is a schematic side view of one more further embodiment of the ground apparatus including the conductive clamp structures in accordance with the present invention.
Figure 5C:
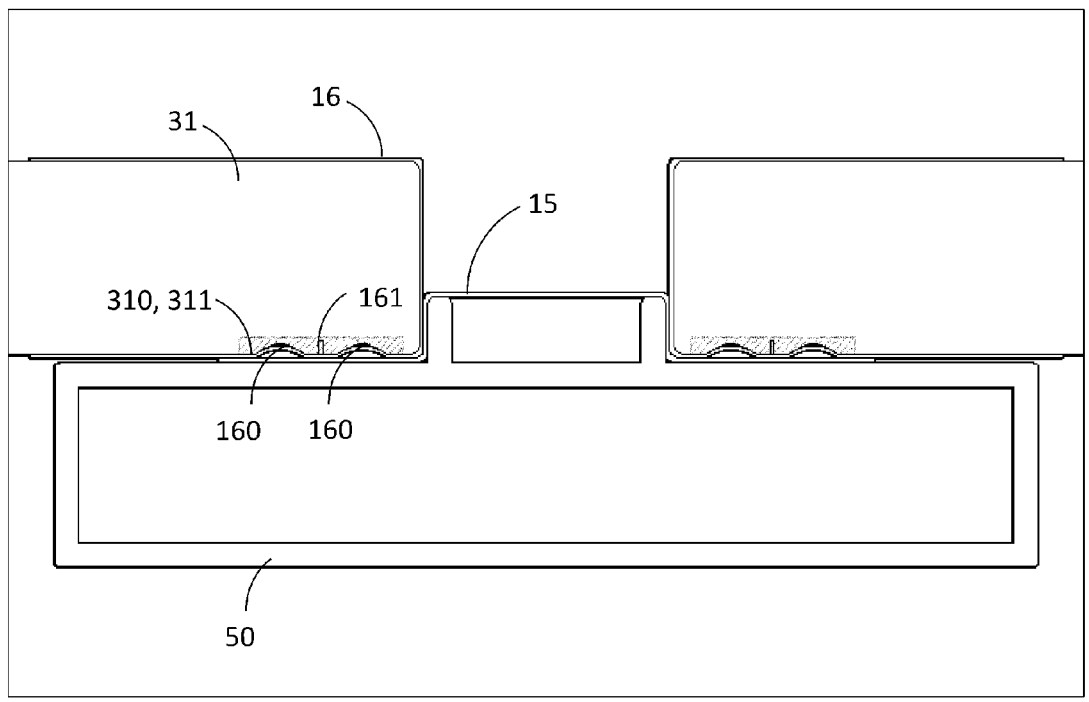
FIG. 5C is a schematic side view of another further embodiment of the ground apparatus including the conductive clamp structures in accordance with the present invention.

Referring now to FIGS. 5A~5C, another embodiment showing the connection of the first ground unit 10 (excluding the ground line 60), the solar cell module 30 and the supportive frame 50 is shown. For the structuring of the first ground unit 10 and the second ground unit 20 is similar except for the connection of the ground line 60, so the following description related to the FIGS. 5A~5C would focus only on the first ground unit 10, more specifically on the flow-ability of the electric charges between the first ground unit 10 and the solar cell module 30. All other components unrelated to this flow-ability such as the ground line 60, the locking members and so on would be omitted herein.

Referring now to FIG. 5A, another embodiment of the ground apparatus in accordance with the present invention is shown. The first ground unit 10 formed as a more complicate bridge structure includes a grounding dock 15 for conduction of electric charges, and a pair of grounding pads 16 located between the grounding dock 15 and the corresponding matching frames 31. By comparing the ground apparatus of FIG. 5A to that of FIG. 4A, the major difference in between is that, in this embodiment, each of the ⊓-shape prolonged ends of the grounding dock 15 does not include the flange structure like the flange 110 of FIG. 4A, and further each of the grounding pads 16 made of a metal plate is introduced to hold the respective matching frame 31 at four corners of the corresponding matching frame 31. A lateral side (the vertical side in the figure) of the grounding pad 16 protrudes at least one flange 160 like the flange 110 of FIG. 4A, but with the difference in that the hill portion of the flange 160 is to contact the conductive surface 310 and the bottom thereof is to contact the grounding dock 15. Thereby, the accumulated electrons can be led out of the ground apparatus through a broader contact area provided by the grounding pad 16 and the grounding dock 15.

Referring now to FIG. 5B, another embodiment of the ground apparatus in accordance with the present invention is shown. The first ground unit 10 is also formed as a complicate bridge structure like FIG. 5A does. The major difference between this embodiment and that of FIG. 5A is that, in this embodiment, the flange 160 of the grounding pad 16 is furnished to contact at the conductive groove 311 of the matching frame 31, in which the conductive groove 311 is structured as the same as that described in the embodiment of FIG. 4B.

Referring now to FIG. 5C, a further embodiment of the ground apparatus (excluding the ground fixation member 12) in accordance with the present invention is shown. The first ground unit 10 is also formed as a complicate bridge structure like either FIG. 5A or FIG. 5B does. The major difference between this embodiment and that of FIG. 5A or FIG. 5B is that, in this embodiment, except for at least one flange 160 formed on a lateral side of the grounding pad 16, at least one knife protrusion 161 (resembling to the knife protrusion 111 of FIG. 4C) is furnished to be located at any position that is able to contact the conductive surface 310 or the conductive groove 311 of the matching frame 31. The inclusion of the knife protrusion 161 to ensure the flow-ability of electric charges.

Referring now to FIGS. 1A, 2A and 3B-3C, the specific solar cell modules that do not connect directly with the first ground unit 10 can utilize the second ground unit 20 to establish connection with the neighboring solar cell modules, such that all the solar cell modules in the array can be electrically coupled and can discharge the electric charges to the ground directly or indirectly through the first ground unit 10.

Figure 6A:
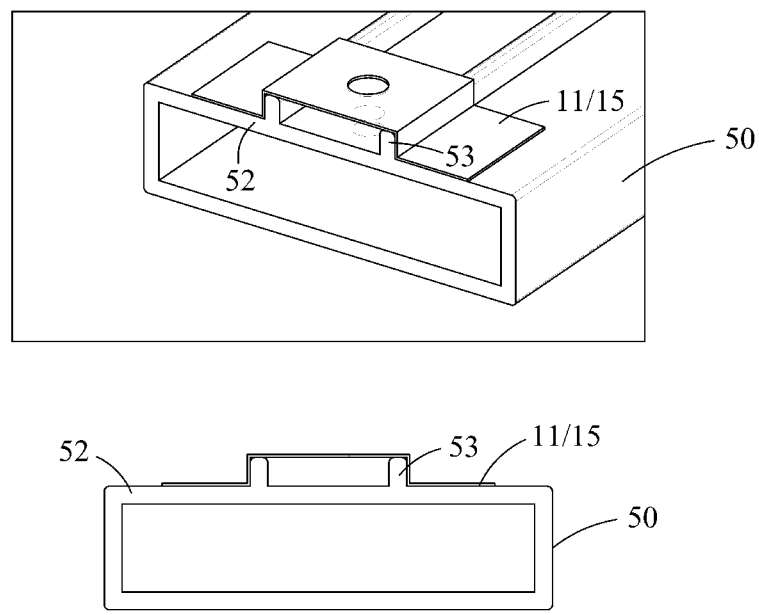
FIG. 6A shows schematically an embodiment of the conductive bridging structure in accordance with the present invention.
Figure 6B:
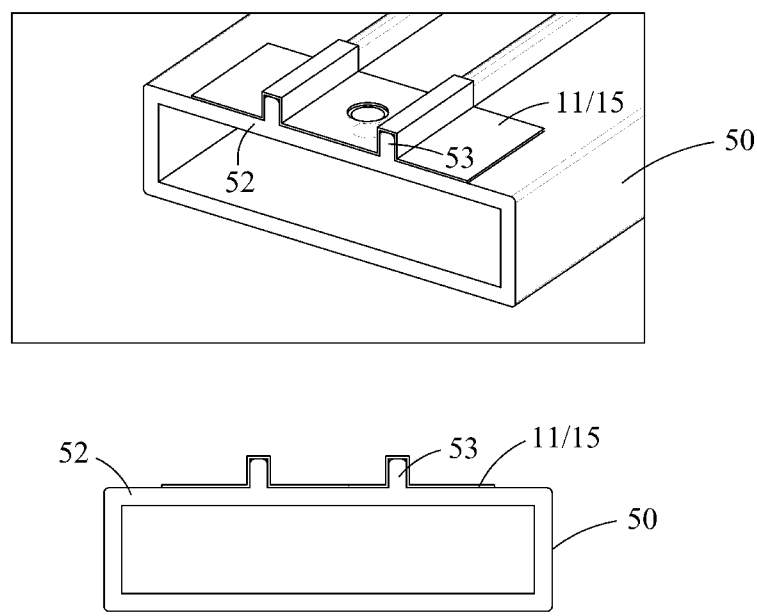
FIG. 6B shows schematically another embodiment of the conductive bridging structure in accordance with the present invention.

Referring now to FIG. 6As and FIG. 6B, a typical shape of the grounding dock 11/15 for the aforesaid embodiments is shown. The grounding dock is a plate structure with a predetermined length. The upper surface of the grounding dock can be parallel to and contact-free from the upper surface 52 of the supportive frame 50. In another embodiment, the grounding dock can be parallel to the upper surface 52 of the supportive frame 50 and extended to cover the protrusion 53 and a portion of the upper surface 52.

Further, the grounding dock 11/15 located at the lateral side of the array is mounted to one side of the solar cell module or to the spacing between two solar cell modules. To the other place of the array, the grounding dock 11/15 is mounted among four solar cell modules. The embodiment and application of the grounding dock for the second ground unit 20 are also similar to those for the first ground unit 10. Yet, a difference between the first ground unit 10 and the second ground unit 20 is that the second ground unit 20 doesn't contact directly with the ground line 60.

Figure 7A:
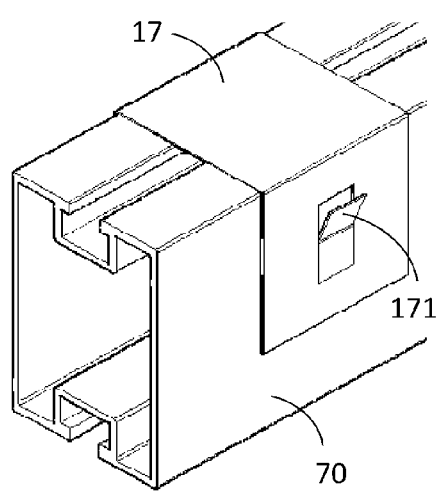
FIG. 7A~7E illustrate various assembly embodiments of the ground apparatus in accordance with the present invention.
Figure 7B:
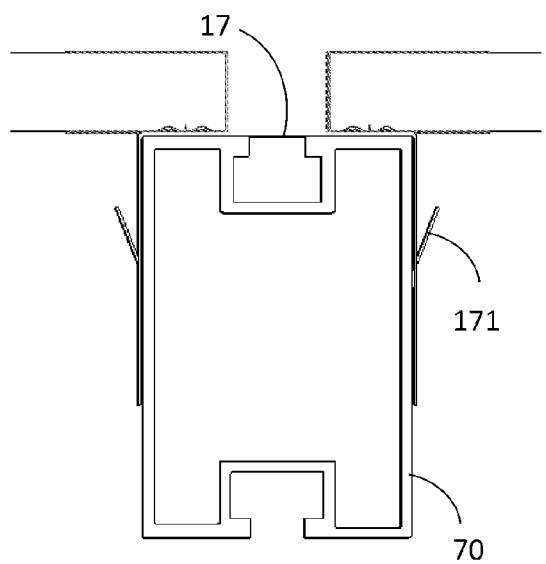

Referring now to FIGS. 7A~7B, other embodiments of the predetermined fastening pattern in accordance with the present invention are shown. By compared with the aforesaid embodiments, the predetermined fastening pattern shown here, the same methodology of integrating electrically the neighboring solar cell modules by the ground units is applied. Namely, in all these embodiments, the first ground units are applied to ground the array of the solar cell modules integrated electrically by both the first and the second ground units. The difference in between falls mainly at the engineering of the supportive frames. To meet variety types of the supportive frames, in this embodiment, another type for the predetermined fastening pattern and the associated grounding docks are disclosed as follows.

As stated above, the conventional supportive frame 70 has a rectangular or square cross section with or without lateral grooves. In his embodiment, the grounding dock 17 is a ⊓-shape metal plate body contacting at an exterior wall of the supportive frame 70. Each of two opposing ends of the ⊓-shape metal plate body is respectively outward extended to include at least one matching member 171. The matching member 171 provides the grounding dock 17 an embedded fixation interface structure to the supportive frame 70. Further, the grounding dock 17 herein can be a single grounding dock or be formed as a plurality of grounding docks for communicating electric charges, which have been elucidated above in the aforesaid embodiments. In particular, the grounding dock 17 can also include flanges, upright protrusions, and any component described.

Figure 7C:
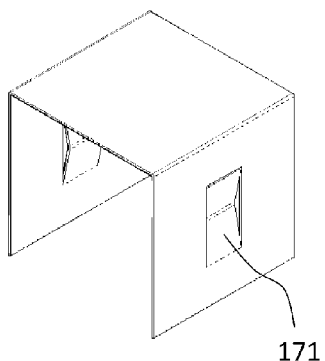
Figure 7D:
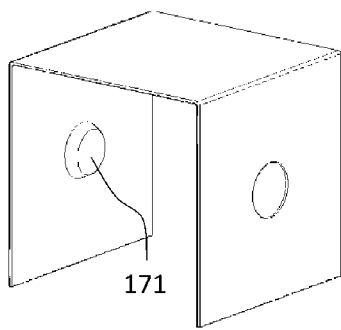
Figure 7E:
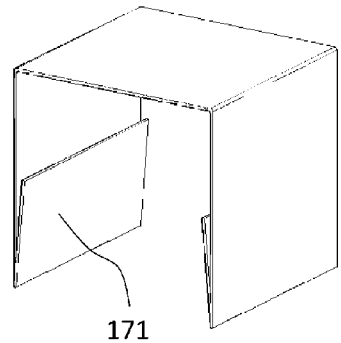
Figure 8:
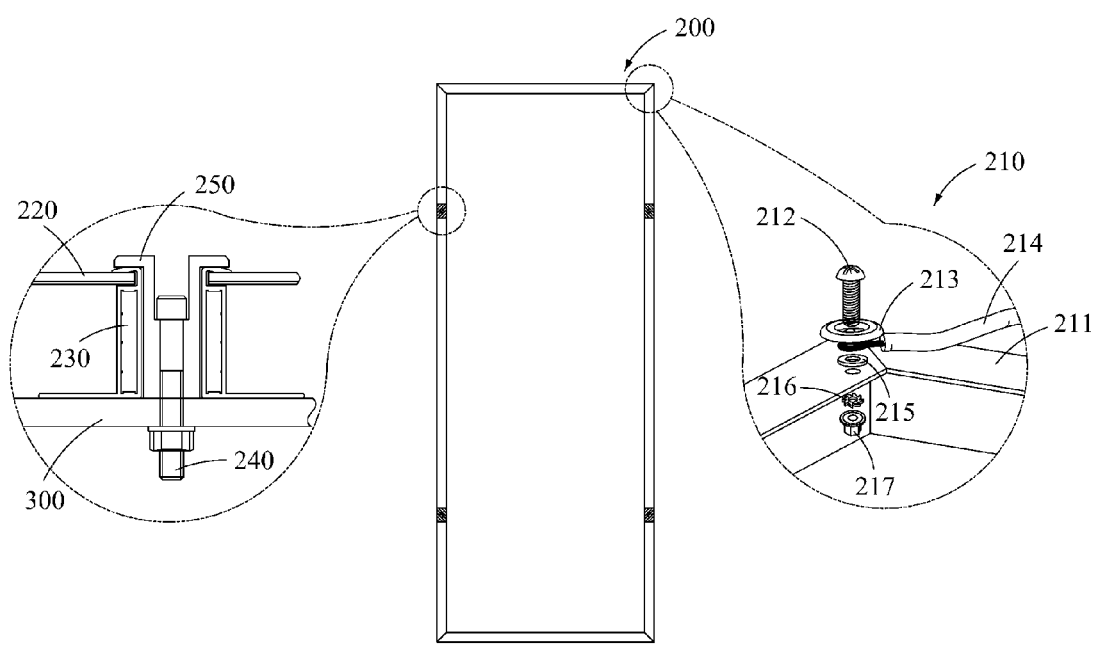
FIG. 8 shows schematically the position and the composition of a conventional ground apparatus in an array of solar cell modules.

Referring now to FIGS. 7C~7E, various embodiments for pairing the grounding docks 17 and the matching members 171 are schematically illustrated. The matching member 171 is formed as an elastic plate shown in FIG. 7C. In FIG. 7D, the matching member 171 is shaped as a flange. In FIG. 7E, the matching member 171 can be a buckle part. In any of the foregoing matching members 171, the embedded connection between the supportive frame 70 and the matching member 171 can be achieved by sleeving the matching member 171 onto the supportive frame 70, and can be further fixed by various auxiliary parts available in the marketplace. Upon such an arrangement provided by the present invention, the installation can be fast, and the material cost can be reduced. Also, though three typical embodiments of the matching member 171 has been disclosed herein, yet such an arrangement shall not limit the embodying of the present invention, and all possible variation thereto shall be within the scope of the present invention.

Accordingly, the grounding dock for the ground apparatus of the solar cell modules presents the following advantages.

1. For each array of the solar cell modules might need only one ground line, and for the ground fixation member is located on the array, so the wiring operation for the ground apparatus of the present invention would have no conventional space limitation problem, and thus the operation can save a lot of time.

2. For the number of the elements required for the grounding is greatly reduced, so the grounding for the array of solar cell modules can be substantially cost down and need less labor.

While the present invention has been particularly shown and described with reference to a preferred embodiment, it will be understood by those skilled in the art that various changes in form and detail may be without departing from the spirit and scope of the present invention.

What is claimed is:

1. A ground apparatus, applicable to an array of plural solar cell modules, each of the solar cell modules being formed by at least one solar panel and a plurality of matching frames packed fixedly to respective lateral sides of the at least one solar panel, the solar cell modules being arranged into an array manner, the ground apparatus comprising:
    at least one first ground unit, mounted on a lateral side of one respective said solar cell module, further including a grounding dock connected to an out-going ground line;
    a plurality of second ground units, mounted on individual lateral sides of the respective solar cell modules, each of the second ground units further having one said grounding dock;
    wherein the grounding dock is formed as a ⊓-shape metal plate having two opposing prolonged ends to extend outward to the respective matching frames, and the ground apparatus is fixed with a predetermined fastening pattern.

2. The ground apparatus of claim 1, wherein the predetermined fastening pattern is a fixation by a ground fixation member.

3. The ground apparatus of claim 1, wherein each of the two opposing prolonged ends of the grounding dock further has at least one flange.

4. The ground apparatus of claim 3, wherein a hill of the flange is to contact with the matching frame (defining a contact area), and the contact area is formed by removing a surface insulation layer from the matching frame so as to make the contact area be a conductive surface.

5. The ground apparatus of claim 4, wherein the each of the two opposing prolonged ends of the grounding dock further has at least one knife protrusion.

6. The ground apparatus of claim 3, wherein a hill of the flange is to contact with the matching frame (defining a contact area), and the contact area is formed by removing a surface insulation layer from the matching frame so as to form a conductive groove at the contact area of the matching frame.

7. The ground apparatus of claim 6, wherein the each of the two opposing prolonged ends of the grounding dock further has at least one knife protrusion.

8. The ground apparatus of claim 1, further including a grounding pad located between the grounding dock and the matching frame, the grounding pad as a plate structure being to hold the respective matching frame at four corners thereof, the grounding pad further protruding at least one flange at a place neighboring to the grounding dock.

9. The ground apparatus of claim 8, wherein a lower surface of the flange is to contact the grounding dock, an upper surface of the flange is to contact the matching frame (defining a contact area), and the contact area is formed by removing a surface insulation layer from the matching frame so as to make the contact area be a conductive surface.

10. The ground apparatus of claim 9, wherein the grounding pad further includes at least one knife protrusion at a place neighboring to the grounding dock.

11. The ground apparatus of claim 8, wherein a lower surface of the flange is to contact the grounding dock, an upper surface of the flange is to contact the matching frame (defining a contact area), and the contact area is formed by removing a surface insulation layer from the matching frame so as to form a conductive groove at the contact area of the matching frame.

12. The ground apparatus of claim 11, wherein the grounding pad further includes at least one knife protrusion at a place neighboring to the grounding dock.

13. A ground apparatus, applicable to an array of plural solar cell modules, each of the solar cell modules being formed by at least one solar panel and a plurality of matching frames packed fixedly to respective lateral sides of the at least one solar panel, the solar cell modules being arranged into an array manner, the ground apparatus comprising:
    at least one first ground unit, mounted on a lateral side of one respective said solar cell module, further including a grounding dock connected to an out-going ground line;
    a plurality of second ground units, mounted on individual lateral sides of the respective solar cell modules, each of the second ground units further having one said grounding dock;
    wherein the grounding dock is formed as a ⊓-shape metal plate having two opposing prolonged ends to extend outward, each of the ends having at least one matching member, and the ground apparatus is fixed with a predetermined fastening pattern.

14. The ground apparatus of claim 13, where the predetermined fastening pattern is a type of embedding fixation.

15. The ground apparatus of claim 13, wherein a top surface of the grounding dock further has at least one flange.

16. The ground apparatus of claim 15, wherein a hill of the flange is to contact with the matching frame (defining a contact area), and the contact area is formed by removing a surface insulation layer from the matching frame so as to make the contact area be a conductive surface.

17. The ground apparatus of claim 16, wherein a top surface of the grounding dock further has at least one knife protrusion.

18. The ground apparatus of claim 15, wherein a hill of the flange is to contact with the matching frame (defining a contact area), and the contact area is formed by removing a surface insulation layer from the matching frame so as to form a conductive groove at the contact area of the matching frame.

19. The ground apparatus of claim 18, wherein a top surface of the grounding dock further has at least one knife protrusion.

20. The ground apparatus of claim 13, further including a grounding pad located between the grounding dock and the matching frame, the grounding pad as a plate structure being to hold the respective matching frame at four corners thereof, the grounding pad further protruding at least one flange at a place neighboring to the grounding dock.

21. The ground apparatus of claim 20, wherein a lower surface of the flange is to contact the grounding dock, an upper surface of the flange is to contact the matching frame (defining a contact area), and the contact area is formed by removing a surface insulation layer from the matching frame so as to make the contact area be a conductive surface.

22. The ground apparatus of claim 21, wherein the grounding pad further includes at least one knife protrusion at a place neighboring to the grounding dock.

23. The ground apparatus of claim 20, wherein a lower surface of the flange is to contact the grounding dock, an upper surface of the flange is to contact the matching frame (defining a contact area), and the contact area is formed by removing a surface insulation layer from the matching frame so as to form a conductive groove at the contact area of the matching frame.

24. The ground apparatus of claim 23, wherein the grounding pad further includes at least one knife protrusion at a place neighboring to the grounding dock.

\* \* \* \* \*